United States Patent [19]
Clarius

[11] Patent Number: 4,698,603
[45] Date of Patent: Oct. 6, 1987

[54] RF AMPLITUDE MODULATOR/MIXER

[75] Inventor: George A. Clarius, Smithtown, N.Y.

[73] Assignee: Grumman Aerospace Corporation, Bethpage, N.Y.

[21] Appl. No.: 859,486

[22] Filed: May 5, 1986

[51] Int. Cl.$^4$ ............................................. H03C 1/00
[52] U.S. Cl. ...................................... 332/31 R; 332/38
[58] Field of Search ................... 332/31 R, 37 R, 38, 332/44; 375/41, 58, 60

[56] References Cited
U.S. PATENT DOCUMENTS
4,199,723 4/1980 Cummings et al. ............. 332/38 X Primary Examiner—Eugene R. Laroche
Assistant Examiner—David Mis
Attorney, Agent, or Firm—Stetina and Brunda

[57] ABSTRACT

A method and apparatus are disclosed for offsetting the DC level of a modulating signal input to a dual balanced modulator. The circuit is adapted to offset a high frequency modulation signal by an amount sufficient to provide the optimum percent modulation of a carrier signal applied to the dual balanced modulator. The offset level to be applied is dependent upon the desired percent modulation and is further affected by the operating modulation and carrier frequencies as well as their respective input power levels.

11 Claims, 10 Drawing Figures

RF AMPLITUDE MODULATOR/MIXER

BACKGROUND OF THE INVENTION

The present invention relates to an offset network that operates to offset an input modulation signal to regulate output modulation. More particularly, the invention relates to DC offset network for offsetting a high frequency modulating signal being fed into a double balanced modulator, in order to enhance amplitude modulation of the carrier.

One of the more traditional methods of modulating a carrier is by means of a double balanced modulator, also referred to as a ring modulator. In a conventional double balanced modulator, four diodes are connected in a ring, such that the anode of one diode is connected to the cathode of the following diode. Thus, current flow is possible in one direction only around the ring. Two transformers are provided with their secondary windings connected to the electrically conjugate pairs of bridge terminals, and their primary windings available for input or output connections. Center taps on the secondary windings may be used for the application of a higher voltage, alternating current, input signal, which alternately commutes the conductive state of a pair of non-adjoining diodes in the ring. If a lower voltage input signal is applied to one of the transformers—which then becomes the input transformer—the commutating action of the higher voltage signal will cause polarity changes of the signal output from the other transformer—which then becomes the output transformer.

If the higher voltage input signal is a high frequency carrier signal and the lower voltage input signal is a modulating signal of a lower frequency, then, under normal operating conditions, and with perfect symmetry of all elements, the output signal will contain only the sum and the difference components of those two frequencies. That is, a double sideband, suppressed carrier, amplitude modulated signal.

In view of the characteristic carrier frequency suppression effected by double balanced modulators, such circuits provide poor amplitude modulation of the carrier signal. The suppression of the carrier frequency with respect to the sideband frequencies, (i.e., the carrier frequency plus or minus the modulating frequency), reduces the carrier modulation. The present invention is directed to an apparatus and method for enhancing the amplitude modulation of the carrier signal that is obtainable from the output of a dual balanced modulator. The invention is intended to have particular application where the carrier frequency signal is in the high frequency range, i.e., greater than one GHz and the modulating frequency is also in the high frequency range, i.e., greater than 10 MHz.

It is known that biasing the modulating signal will regulate the part of the carrier cycle during which the diodes operate in a low impedance condition. The bias signal may also be useed to compensate for the irregularities of the conductivity of the switching diodes such that differences in the conduction characteristics of each diode do not result in degradation of the output signal.

Though other systems have proposed providing a bias signal to regulate the operation of diodes in a dual balanced modulator, none of those systems have disclosed or suggested the use of such a bias signal to enhance the percent modulation of the carrier frequency signal. Additionally, prior double balanced modulators incorporating bias signals are typically designed to facilitate low frequency operation and are unsuitable for use in the high frequency ranges in that the present invention finds application, e.g., to simulate a multiplexed radar return signal, that is amplitude modulated in accordance with the angle of arrival of the radar return signal.

SUMMARY OF THE INVENTION

A method and apparatus are disclosed for offsetting the DC level of a modulating signal input to a dual balanced modulator. The circuit is adapted to offset a high frequency modulation signal by an amount sufficient to provide the optimum amplitude modulation of a carrier signal applied to the dual balanced modulator. The offset level to be applied is dependent upon the desired percent modulation, and is further affected by the operating modulation and carrier frequencies.

DETAILED DESCRIPTION OF THE PRESENTLY PREFERRED EMBODIMENT

Figure 1:
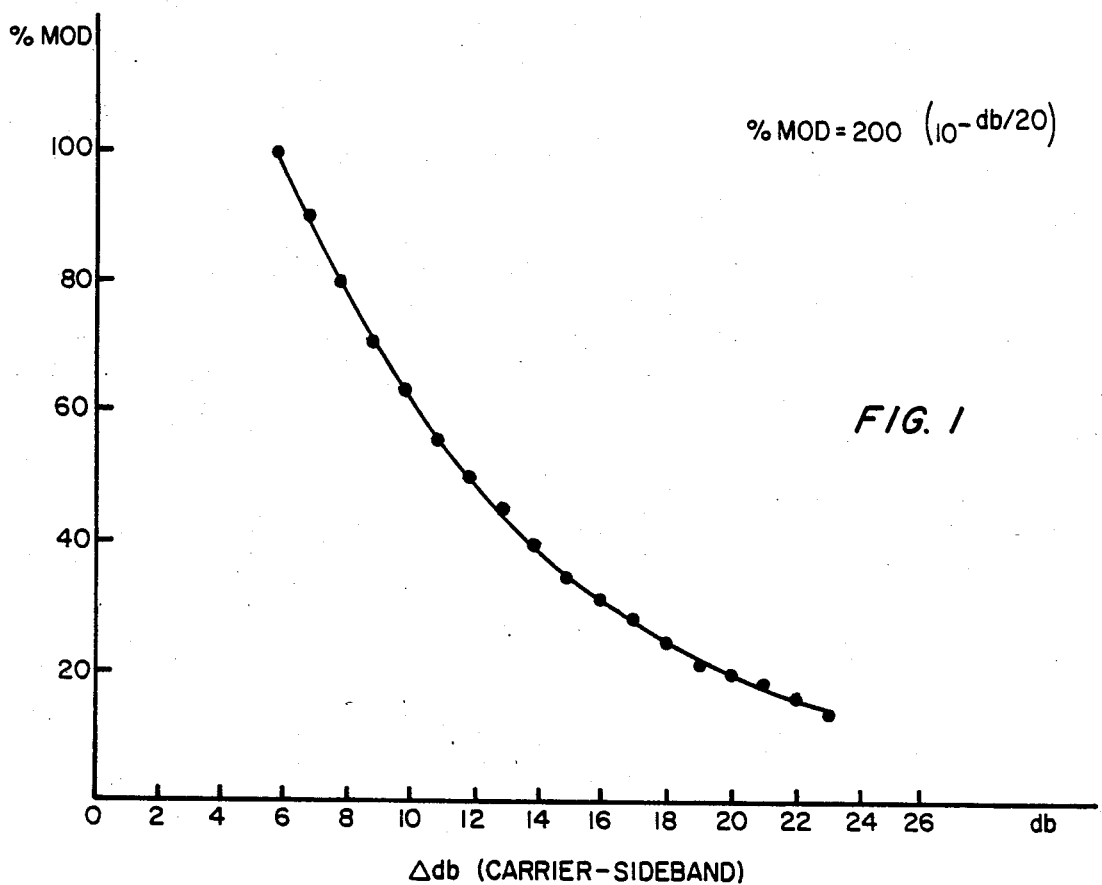
FIG. 1 is a graph showing the relationship between the percent modulation and the output power spectrum in a dual balanced modulator.

FIG. 1 generally illustrates output characteristics of a dual balanced modulator showing variations in the percent modulation of the carrier signal in response to variations in the relative levels of the carrier and the sideband power contained of the output signal. As shown in FIG. 1, as the difference between the carrier power and the sideband power ($\Delta$dbm) is reduced, the percent modulation of the carrier signal is increased. Where the carrier signal power is approximately 6 dbm greater than the sideband signal power, the dual balanced modulator provides 100 percent modulation of the carrier signal. Variations in the relative levels of the carrier and sideband power are generally linearly related to decreases in the percent modulation over a large portion of the response curve. Accordingly, increasing the input carrier power level with respect to the sideband power level will increase the percent modulation of the carrier signal output. Such power level adjustments may be generally effected by increasing the power of the carrier signal in relation to the modulation signal. However, such increases in the power of the carrier input signal are not always practical. The present invention provides circuitry and a method for obtaining the desired percent modulation of the carrier signal without the need for increasing the power of the input carrier signal.

Figure 2:
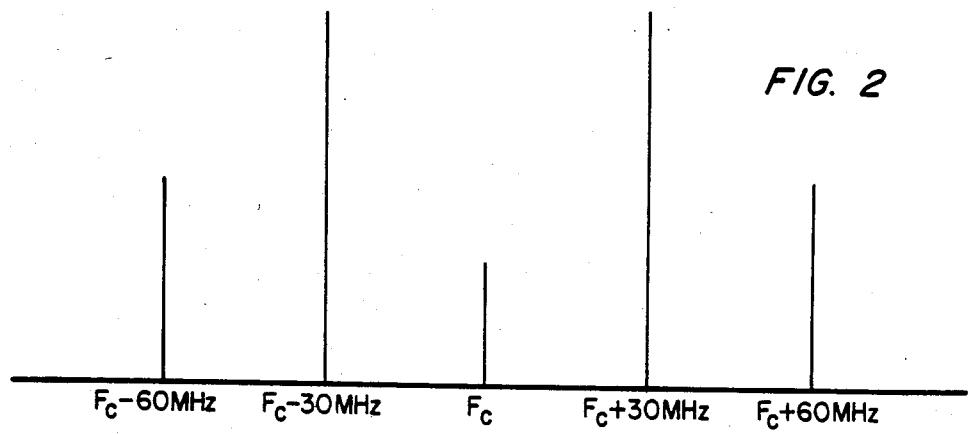
FIG. 2 is an illustration of the typical output characteristics of a dual balanced modulator.
Figure 3:
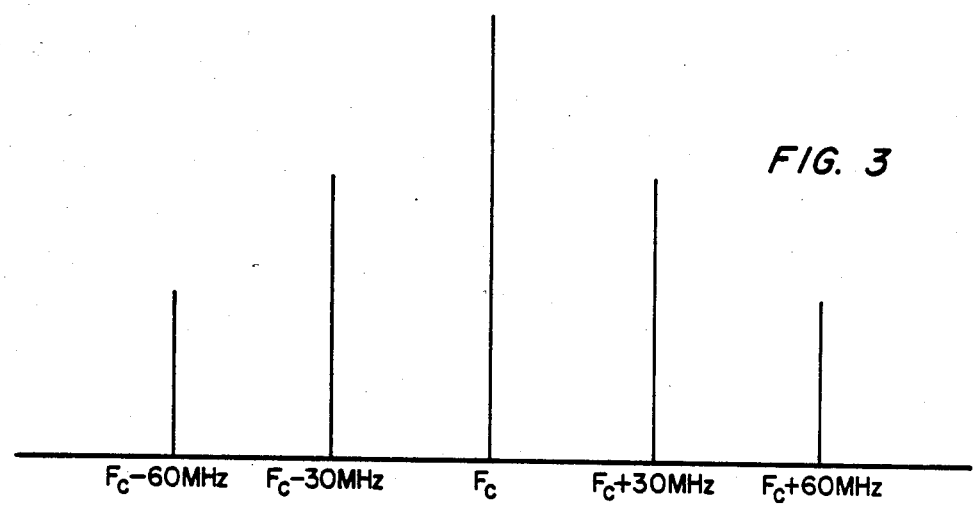
FIG. 3 illustrates the output characteristics of a dual balanced modulator biased in accordance with the present invention.

FIG. 2 illustrates the typical output characteristics of a dual balanced modulator with a 30 MHz modulating signal applied. As shown in FIG. 2 the carrier frequency power level is substantially less than the sideband frequency power level. As illustrated at FIG. 3, the present invention operates to increase the carrier frequency power level in relation to the sideband frequency power level, as shown at FIG. 3, to thereby permit the desired modulation of the carrier.

Figure 4:
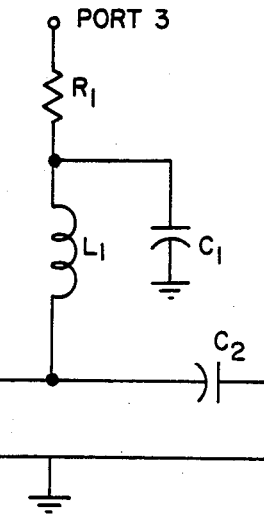
FIG. 4 is a circuit diagram of an exemplary DC offset circuit in accordance with the present invention.

FIG. 4 illustrates an exemplary offset network adapted to provide a DC bias to the modulating signal in accordance with the present invention. Referring to FIG. 4, a modulating signal is applied to Port 1 of the circuit, with an offset modulating frequency signal being output at Port 2 of the circuit. Port 2 is connectable to the If Input of a dc coupled conventional dual balanced modulator. The DC offset input may be applied to the circuit via Port 3. Capacitor C2 is a blocking capacitor adapted to block the DC offset input from reaching the RF input source. Inductor L1 and capacitor C1 are adapted to cooperate to keep any RF modulating signals from Port 1 from reaching the Port 3 connection to the DC source. Inductor L1 is selected to have an inductance which will develop a sufficiently high impedance at the operating modulating frequency to substantially block the RF input from reaching Port 3. Capacitor C1 is selected to short circuit to ground any RF input signal that manages to pass through inductor L1. Resistor R1 is a current limiting resistor that further opposes passage of any RF signal into the DC supply connected to Port 3. Resistor R1 may be implemented as a variable resistor to allow the offset voltage to be adjusted while opposing passage of the RF signal. Alternatively, the DC offset level can be adjusted at the DC supply connected to Port 3.

In the presently preferred embodiment, intended for operation at a 30 MHz modulating rate with a 3 GHz carrier signal, the components were selected to have the following component values.

| C1 | 150 pf |
| C2 | .01 uf |
| L1 | 150 mh |
| R1 | 2K Ohms |
| DC bias | +/− 5 to 7 volts |

Figure 8A:
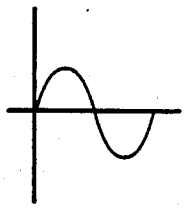
FIGS. 8A, 8B and 8C illustrate the signals appearing at the ports of the circuit shown at FIG. 4.
Figure 8B:
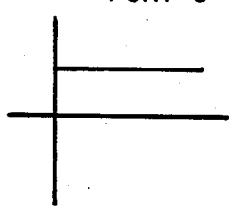
Figure 8C:
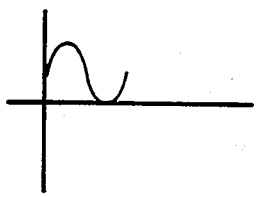

FIGS. 8A, B, and C illustrate the signals appearing at Ports 1, 2, and 3 of circuit illustrated at FIG. 4. As shown in FIG. 8A, the RF input at Port 1 is a sinusoidal signal symmetrical about the zero volt axis. As shown in FIG. 8B, offset input through Port 3 is a DC voltage. Though shown as a positive voltage, it is to be understood that a positive or negative voltage may be used for the DC input to Port 3. As shown at FIG. 8C, the output from the offset network at Port 2 (to the dual balanced modulator) is the sinusoidal RF signal offset by the DC voltage level input at Port 3.

Figure 5:
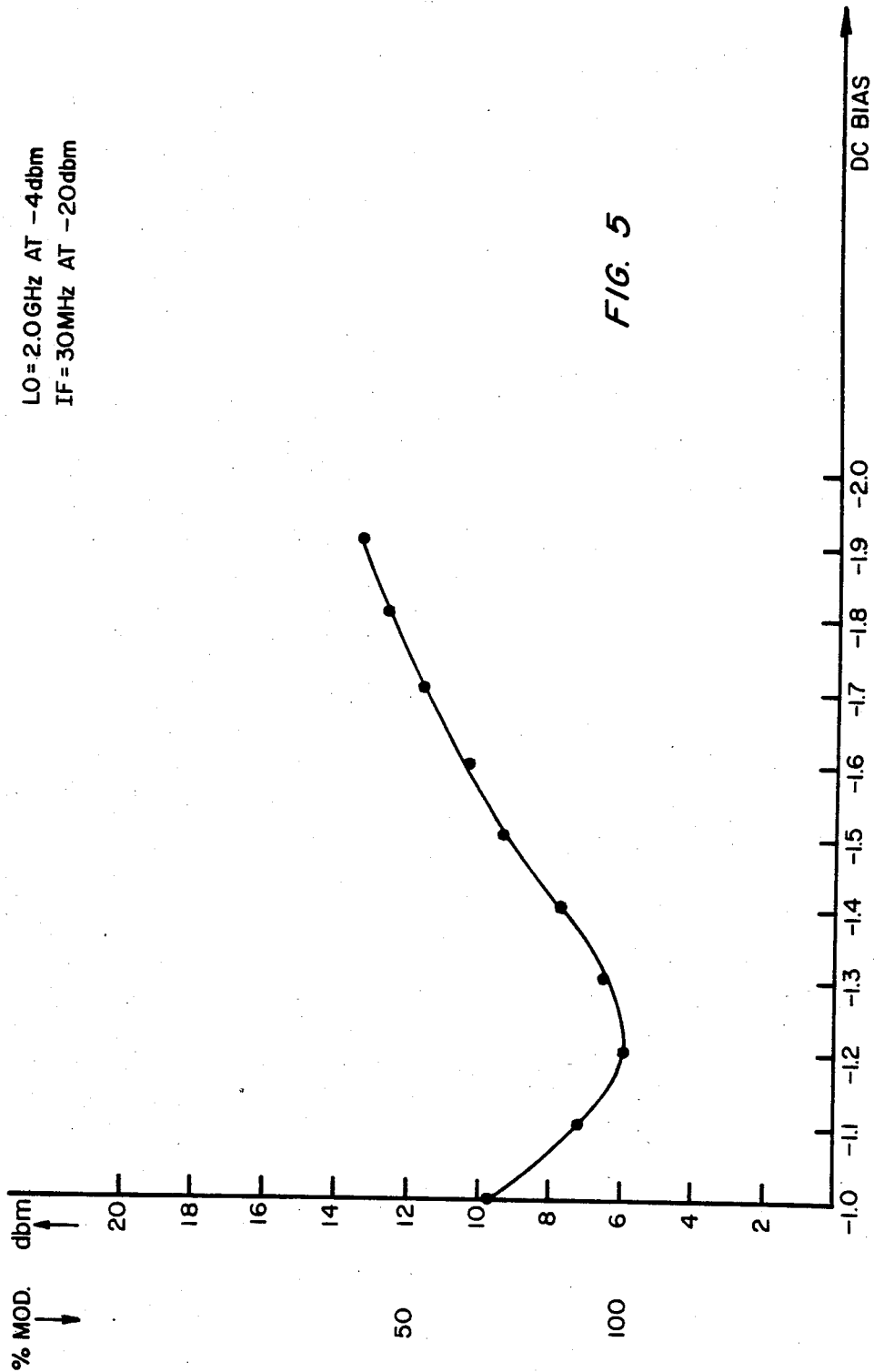
FIG. 5 is a graph of the carrier suppression and percent modulation in relation to an applied DC bias for a 2 GHz carrier and 30 MHz modulating signal.
Figure 6:
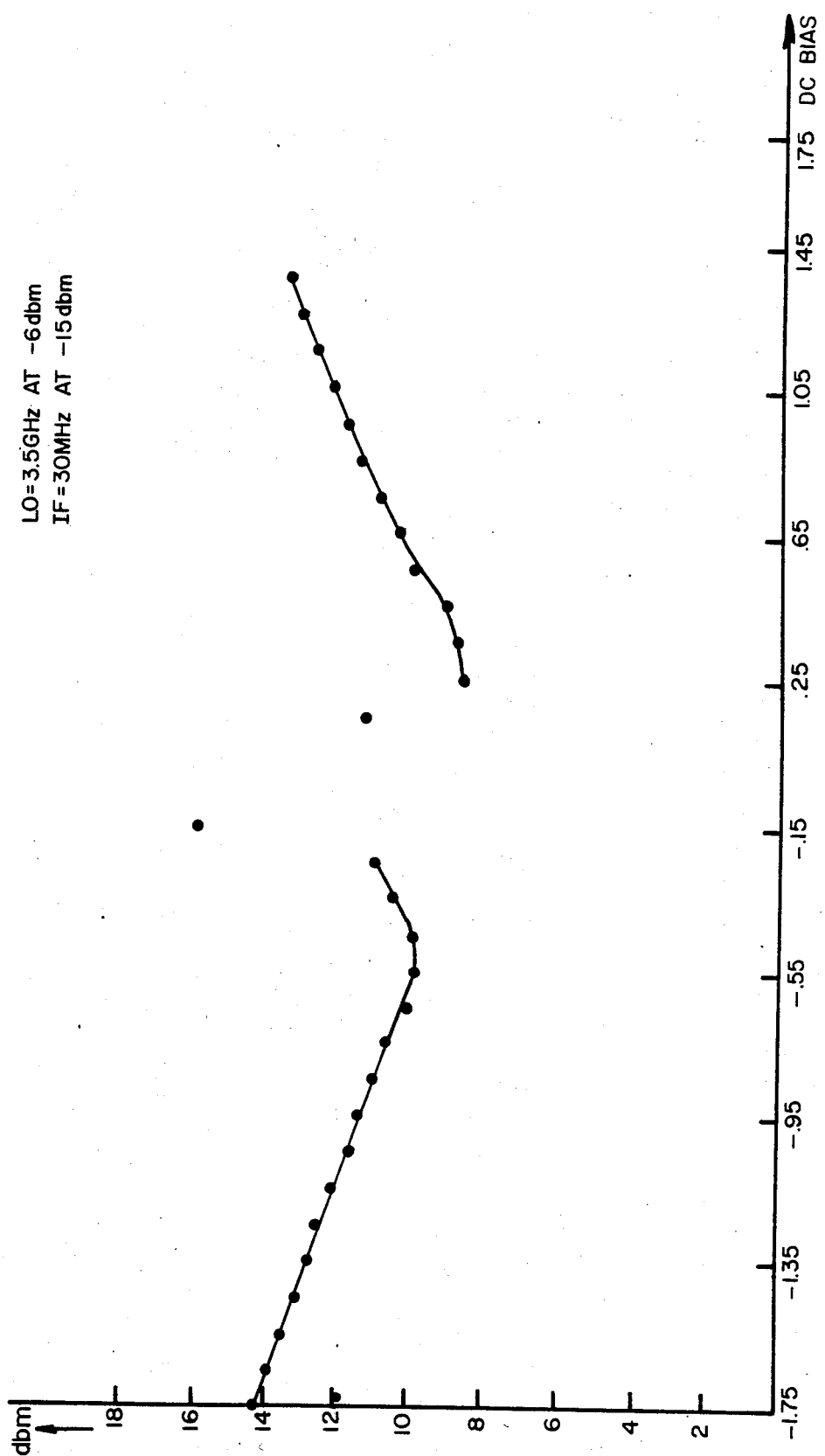
FIG. 6 is a graph of the carrier suppression and percent modulation in relation to an applied DC bias for a 3.5 GHz carrier and 30 MHz modulating signal.
Figure 7:
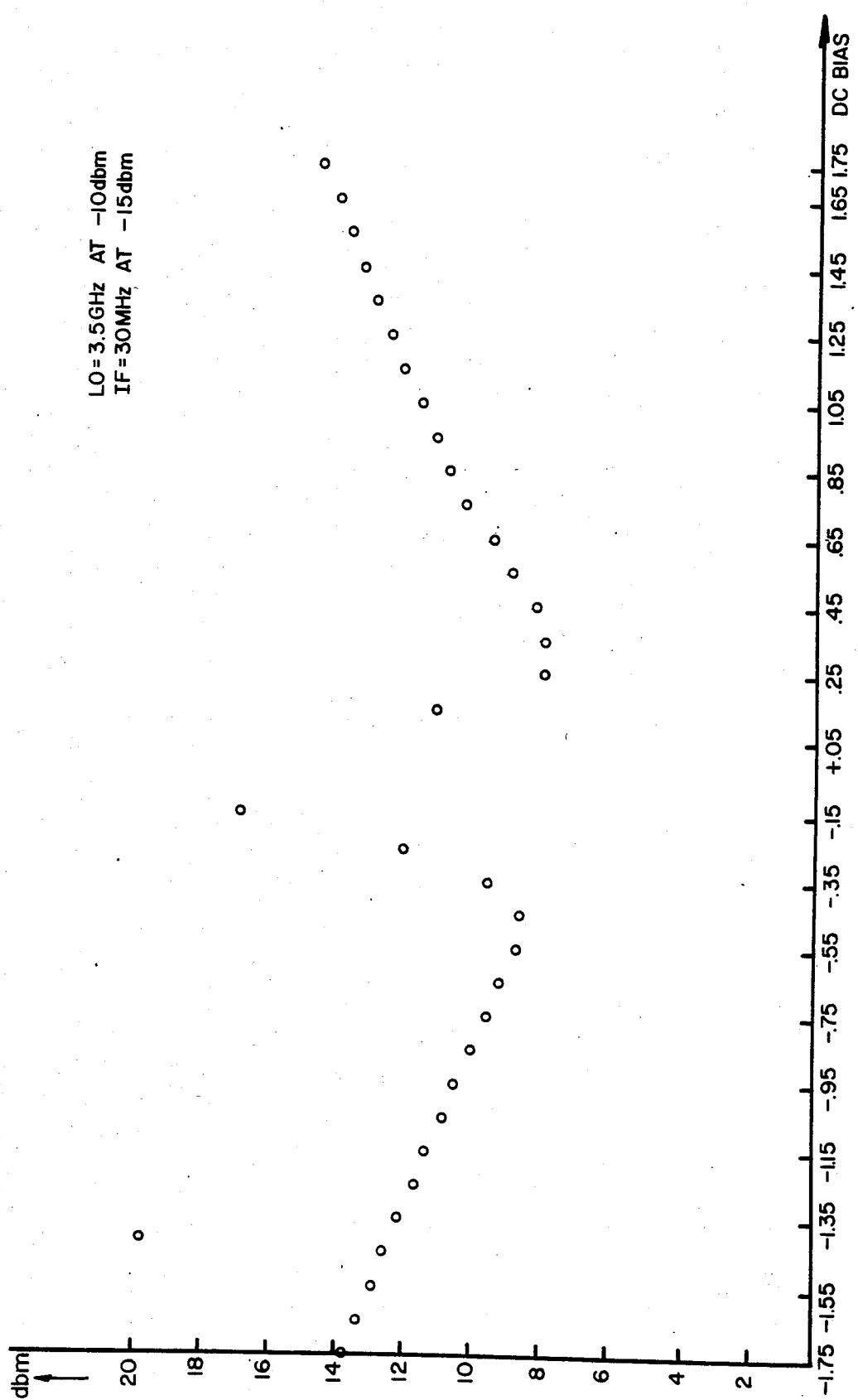
FIG. 7 is a graph of the carrier suppression and percent modulation in relation to an applied DC bias for a low power 3.5 GHz carrier and 30 MHz modulating signal.

As explained in more detail in connection with FIGS. 5, 6, and 7, the value of the DC offset input is selected in view of the intended operating frequencies and the characteristic operation of the dual balanced modulator such that the percent modulation of the carrier frequency may be optimized. It is understood that the characteristics is depicted at FIGS. 5, 6, and 7 represent the output of dual balanced modulator fed by the circuit of FIG. 4 with a modulating frequency of approximately 30 MHz. and with carrier frequencies of 2.0 GHz, 3.5 GHz and 3.5 GHz respectively. The FIG. 6 and FIG. 7 characteristics differ in view of differences in applied carrier signal power level.

The input levels to the circuit characterized at FIG. 5. are as follows:

| Carrier Frequency | 2.0 GHz, −4 dbm |
| Modulating Frequency | 30 MHz, −20 dbm |

Referring to FIG. 5, it can be seen that as the DC bias varies between −1.0 and −2.0 volts, the difference between the first harmonic frequency signal and the carrier, (and consequently the percent modulation) vary according to a nonlinear function. As the DC bias level varies between −1.0 volts and −1.2 volts, the percent modulation increases to approximately 100 percent, and the difference between the first harmonic and carrier power levels (ΔdbM) is decreased from approximately 10 dbm to approximately 6 dbm. As the DC bias level is further increased in the negative direction, the percent modulation decreases and db increases.

FIG. 6 illustrates the characteristic operation of a similar circuit wherein the carrier frequency and modulating frequency are as follows:

| Carrier Frequency | 3.5 GHz, −10 dbm |
| Modulating Frequency | 30 MHz, −15 dbm |

As shown at FIG. 6, the highest percent modulation, obtainable in the exemplified circuit (approximately 75 percent) corresponds to bias voltage levels of approximately −0.50 and +0.25 volts. Variations in bias voltage about those points results in decreases in the percent modulation of the carrier frequency in the output signal. Consequently, the greatest percent modulation of the FIG. 4 circuit, operating at the specified levels, is obtainable with the modulator signal offset by −0.50 or +0.25 volts.

FIG. 7 illustrates the characteristic operation of a dual balanced modulator wherein the carrier and modulating signals are as follows:

| Carrier Frequency | 3.5 GHz, −6.0 dbm |
| Modulating Frequency | 30 MHz, −15 dbm |

As shown at FIG. 7 the highest percent modulation of the lower power carrier signal input to the dual balanced modulator (i.e., −6.0 dbm) is obtainable where the bias voltage is in the region of −0.50 volts or +0.25 volts. At those points, the difference between the output power at the carrier frequency and the output power at the sideband frequency is at a minimum.

As will be apparent from the operating characteristics depicted at FIGS. 5, 6, and 7, the bias voltage that will produce the highest percent modulation of the carrier frequency varies with changes in the input frequency and the power levels of the carrier frequency and the modulating frequency. The output characteristics will also vary in accordance with the components used to effect the blocking functions of the DC offset network. The optimum DC bias level for a particular given dual balanced modulator may be determinable experimentally with the above disclosure in mind or may be computed once all the characteristics of the various circuit components are identified. In view of the teachings provided by the present invention, it is anticipated that optimization of the DC bias level in accordance with experimental techniques may be effected by relatively simple output power measurements well understood to those skilled in the field, and without undue experimentation.

Though the present invention has been disclosed in connection with the presently preferred embodiment, it is further understood that various modifications and additions to that embodiment may be made without departing from the scope or spirit of the present invention. As disclosed above, changes in the operating frequencies or power levels may effect the optimum bias level to be applied to obtain the various modulation of the carrier signal. Variations in the values of components used to form the blocking functions of the offset network may also be made in view of frequency changes in the applied signals and may also impact the optimum offset voltage. These and other changes that will affect the particular voltage levels and component values may be made within the scope of the present invention.

What is claimed is:

1. A method of facilitating amplitude modulation of a high frequency, low power carrier signal applied to a dual balanced modulator comprising:
    (a) providing a high frequency modulating signal to a first input of an offset circuit, said offset circuit being connectable to a first input to a dual balanced modulator;
    (b) providing a DC bias signal to a second input to the offset circuit;
    (c) offsetting the DC level of the modulating signal to an offset level responsive to the DC bias signal; and
    (d) adjusting the amplitude of the DC bias signal to a DC level corresponding to a desired percent modulation of the carrier signal output from the dual balanced modulator.

2. The method as recited in claim 1 wherein the step of adjusting the amplitude of the DC bias signal comprises adjusting the amplitude to a level corresponding to the highest obtainable percent modulation of the carrier signal obtainable from the dual balanced modulator.

3. The method as recited in claim 1 wherein the step of adjusting the amplitude of the DC bias signal comprises biasing the modulating signal to a DC level producing between 50 and 100 percent amplitude modulation of the carrier signal from the dual balanced modulator.

4. The method as recited in claim 1 wherein the step of adjusting the amplitude of the DC bias signal comprises biasing the carrier to compensate for attenuation of the carrier signal with respect to carrier sidebands in the output of the dual balanced modulator.

5. The method as recited in claim 4 wherein the step of biasing the carrier to a level to compensate for attenuation of the carrier with respect to the sideband comprises biasing the carrier to compensate for high frequency effects of electrical components used to isolate the modulating signal input and the bias level input.

6. The method as recited in claim 1 further comprising the step of electrically blocking signals at each of said first and second inputs to said offset circuit from reaching the other of said first and second inputs.

7. The method as recited in claim 1 wherein the step of providing a high speed modulating signal comprises providing a modulating signal of at least 30 MHz.

8. The method as recited in claim 1 wherein the step of providing a high frequency carrier signal comprises providing a carrier signal of at least 2.06 GHz.

9. An offset circuit for adjusting the DC level of a modulating signal input to a dual balanced modulator comprising:
    (a) a first port for receiving a modulating signal;
    (b) a second port for receiving a DC bias signal;
    (c) coupling circuitry connected to said first and second ports for offsetting the modulating signal received at said first port by a voltage level responsive to the DC bias signal received at said second port, said coupling circuit having an output connectable with a modulation signal input to a dual balanced mixer; and
    (d) said DC voltage being selected to a voltage regulator for varying the amplitude of the DC bias signal in order to amplitude modulate the carrier signal output from the dual balanced modulator to an optimum percent modulation level.

10. The circuit as recited in claim 9 further comprising a blocking capacitor connected to said first port and adapted to block DC signals from reaching said second port.

11. The offset circuit as recited in claim 9 further comprising a first inductor connected between said first and second ports and a shorting capacitor connected to said second port, said first inductor and said shorting capacitor being adapted to opposed transmission of said modulating signal to said second port.

* * * * *